(12) United States Patent
Bauer et al.

(10) Patent No.: US 6,548,121 B1
(45) Date of Patent: Apr. 15, 2003

(54) METHOD FOR PRODUCING ADHESIVE SURFACE COATINGS

(75) Inventors: Michael Bauer, Wittnau (DE); Manfred Köhler, deceased, late of Freiburg (DE), by Vivian Köhler, Antoin Kamran Köhler, Colin Wewoil Köhler, Mark Wenia Köhler, legal representatives; by Inga Köhler, legal representative, Berlin (DE); Martin Kunz, Efringen-Kirchen (DE); Ljubomir Misev, Breitenbach (CH)

(73) Assignee: Ciba Specialty Chemicals Corporation, Tarrytown, NY (US)

( * ) Notice: Subject to any disclaimer, the term of this patent is extended or adjusted under 35 U.S.C. 154(b) by 0 days.

(21) Appl. No.: 09/830,485

(22) PCT Filed: Oct. 20, 1999

(86) PCT No.: PCT/EP99/07942

§ 371 (c)(1),
(2), (4) Date: Jan. 9, 2002

(87) PCT Pub. No.: WO00/24527

PCT Pub. Date: May 4, 2000

(30) Foreign Application Priority Data

Oct. 28, 1998 (CH) ............................................. 2178/98
Dec. 14, 1998 (CH) ............................................. 2473/98

(51) Int. Cl.$^7$ .............................. B05D 1/38; B05D 3/06
(52) U.S. Cl. ....................... 427/509; 427/512; 427/513; 427/517; 427/518; 427/519; 427/520; 427/535; 427/536; 427/538; 427/551; 427/553; 427/554; 427/556; 427/407.2; 427/409; 427/412; 427/412.1; 427/419.2
(58) Field of Search ................................ 427/509, 512, 427/513, 517, 518, 519, 520, 535, 536, 538, 551, 553, 554, 556, 407.2, 409, 412, 412.1, 419.2, 491, 534, 552, 555, 558

(56) References Cited

FOREIGN PATENT DOCUMENTS

EP     487323     *  5/1992
EP     0 575 798     12/1993

OTHER PUBLICATIONS

Kunz et al, Vakuum in Forschung und Praxis, 13(2), pp 115–120, 2001.*
Kunz, European Coatings Conference, Session 2, pp 115–128, 2001.*
Carlini et al, New Polymeric Mat., 1, pp 63–83, 1987.*
Allen et al, Eur. Polym. J., 23(12), pp 985–987, 1987.*
H. Jacobasch et al., Farbe & Lack, 99 (7) 1993, pp. 602–607.
Wang et al., Journal of Polymer Science: Part A: Polymer Chemistry, vol. 31, pp. 1307–1314 (1993).
J. F. Friedrich et al., Surface and Coatings Technology vol. 59, (1993) pp. 371–378.

* cited by examiner

*Primary Examiner*—Erma Cameron
(74) *Attorney, Agent, or Firm*—Tyler A. Stevenson

(57) ABSTRACT

The invention relates to a process for the production of strongly adherent coatings on an inorganic or organic substrate that comprises, in a first step a) subjecting the inorganic or organic substrate to the action of a low-temperature plasma discharge, a corona discharge, high-energy UV radiation or electron radiation, then discontinuing the radiation or discharge; in a further step b) under vacuum or at normal pressure, applying one or more photoinitiators containing at least one ethylenically unsaturated group to the inorganic or organic substrate, and allowing reaction with the free-radical sites formed there; and c1) coating the substrate so precoated with photoinitiator with a composition comprising at least one ethylenically unsaturated monomer or oligomer, and curing the coating by means of UV/VIS radiation or c2) depositing a metal, semi-metal oxide or metal oxide from the gaseous phase, in the presence of UV light, on the substrate so precoated with photoinitiator. The invention relates also to the use of photoinitiators having at least one ethylenically unsaturated group in the production of such layers and to the strongly adherent coatings themselves.

20 Claims, No Drawings

METHOD FOR PRODUCING ADHESIVE SURFACE COATINGS

The invention relates to a process for the production of strongly adhering coatings on inorganic or organic substrates. The invention relates also to the use of photoinitiators having at least one ethylenically unsaturated group in the production of such layers, and to the strongly adherent coatings themselves.

The adhesion of finishes, coatings or metallic layers on inorganic or organic substrates, especially on non-polar substrates such as polyethylene, polypropylene or fluorine-containing polyolefins, for example those known under the trade name Teflon®, is frequently inadequate, with the result that it is necessary to carry out additional coating steps in order to obtain satisfactory results. One possibility lies in first of all applying special priming coatings, so-called primers, and only then applying the desired coating thereto.

A further possibility comprises subjecting the substrates to be coated to plasma or corona treatment and then coating them, it being possible in addition for a procedure for grafting with, for example, acrylate monomers (J. Polym. Sci., Part A: Polym. Chem. 31, 1307–1314 (1993)) to be carried out between those two operations.

The production of low-temperature plasmas and the plasma-assisted deposition of thin organic or inorganic layers have been known for some time and are described, for example, by A. T. Bell, "Fundamentals of Plasma Chemistry" in "Technology and Application of Plasma Chemistry", edited by J. R. Holahan and A. T. Bell, Wiley, New York (1974), and by H. Suhr, Plasma Chem. Plasma Process 3(1),1, (1983).

It is also known that, for example, plastics surfaces can be subjected to plasma treatment and as a result the subsequent finish exhibits improved adhesion to the plastics substrate. This has been described by H. J. Jacobasch et al. in Farbe+Lack 99(7), 602–607 (1993) for low-temperature plasmas under vacuum conditions, and by J. Friedrich et al. in Surf. Coat. Technol. 59, 371–6(1993) for plasmas ranging from in vacuo up to normal pressure conditions, the low-temperature plasma changing over to a corona discharge over that range.

It has now been found that coatings having especially good adhesion can be obtained with photocurable surface-coating compositions by grafting a photoinitiator having at least one ethylenically unsaturated group onto the substrate to be coated, providing the so grafted substrate with a photocurable surface-coating layer and curing that layer. The coatings obtained have a surprisingly good adhesion, the deterioration of which is insignificant even after storage or exposure to sunlight for several days.

The process is simple to carry out and allows a high throughput per unit of time, since no lengthy drying steps or slow crosslinking reactions are required. The process is especially well suited to workpieces that are composed of various plastics and/or metals or glasses and that without pretreatment would therefore exhibit different degrees of adhesion to the different components or that in the case of a conventional primer treatment exhibit different affinities for the primer.

The invention relates to a process for the production of strongly adherent coatings on an inorganic or organic substrate that comprises, in a first step a) subjecting the inorganic or organic substrate to the action of a low-temperature plasma discharge, a corona discharge, high-energy UV radiation or electron radiation, then discontinuing the radiation or discharge; in a further step b) under vacuum or at normal pressure, applying one or more photoinitiators containing at least one ethylenically unsaturated group to the inorganic or organic.substrate, and allowing reaction with the free-radical sites formed there; and c1) coating the substrate so precoated with photoinitiator with a composition comprising at least one ethylenically unsaturated monomer or oligomer, and curing the coating by means of UV/VIS radiation or c2) depositing a metal, semi-metal oxide or metal oxide from the gaseous phase, in the presence of UV light, on the substrate so precoated with photoinitiator.

Possible methods of obtaining plasmas under vacuum conditions have been described extensively in the literature. The electrical energy in such methods can be coupled in by inductive or capacitive means and may be direct current or alternating current, it being possible for the frequency of the alternating current to vary from a few kHz up into the MHz range. A power supply in the microwave range (GHz) is also possible.

The principles of plasma production and maintenance are described, for example, in the above-mentioned review articles of A. T. Bell and H. Suhr.

There may be used as primary plasma gases, for example, He, argon, xenon, $N_2$, $O_2$, steam or air.

The process according to the invention is not sensitive per se in respect of the coupling-in of the electrical energy.

The process can be carried out batchwise, for example in a rotating drum, or, in the case of films, fibres or woven fabrics, continuously. Such procedures are known and are described in the prior art.

The process. can also be carried out under corona discharge conditions. Corona discharges are produced under normal pressure conditions, air most commonly being used as the ionised gas. Although other gases are also possible in principle, they necessitate the use of a closed system in order to exclude atmospheric air. Another possibility comprises the use of air as the ionisation gas in corona discharges, so that an apparatus open to the outside can be used and, for example, a film can be drawn through continuously between the discharge electrodes. Such process arrangements are known and are described, for example, in J. Adhesion Sci. Technol. Vol 7, No. 10, 1105, (1993). When a corona discharge is used in an open apparatus, the procedure is preferably carried out with the exclusion of oxygen, which can be achieved by a sufficiently large flow of inert gas.

The process can also be carried out using high-energy electromagnetic radiation to treat the substrates in vacuo or with the exclusion of oxygen. A suitable high-energy electromagnetic radiation is one that is capable of generating free radicals on the surface. Examples include short-wave UV radiation and X-radiation. In that connection, mention may be made especially of electron beams, as already used for the curing of surface-coating compositions and paints and the adhesive bonding of films. It is also possible, however, to use short-wave UV radiation (especially vacuum UV radiation), such as that produced by commercially available UV lamps or by excimer lamps. Radiation having a wavelength of less than 300 nm, especially less than 260 nm, is preferred.

In addition to conventional lamps for the irradiation of large areas, it is also possible to use lasers that operate in the corresponding wavelength range for pointwise irradiation of, or for image-forming "writing" on, the surface. The use of masks or writing lasers renders possible the selective loading of only certain areas with photoinitiator, which results in different degrees of wetting and, in a subsequent coating, different degrees of adhesion.

The substrates provided with grafted-on photoinitiator can also be irradiated imagewise by irradiation through a mask, or using laser beams which are moved over the surface, with the result that there is further surface modification, but only in the irradiated areas. Using such procedures it is possible, for example, to produce patterns in which the hydrophobic/hydrophilic properties and/or metallisation vary. When the imagewise irradiation is carried out in the presence of a formulation that cures by means of radiation, it is possible to produce patterns in which the adhesion and/or tackiness and/or colour and/or other properties governed by the formulation vary.

The inorganic or organic substrate to be treated can be in any solid form. Preferably, the substrate is in the form of a powder, a fibre, a film or a three-dimensional workpiece.

Preferably, the inorganic or organic substrate is a thermoplastic, elastomeric, inherently crosslinked or crosslinked polymer, a metal oxide, a glass or a metal.

Examples of thermoplastic, elastomeric, inherently crosslinked or crosslinked polymers are listed below.

1. Polymers of mono- and di-olefins, for example polypropylene, polyisobutylene, polybutene-1, poly-4-methylpentene-1, polyisoprene or polybutadiene and also polymers of cycloolefins, e.g. of cyclopentene or norbornene; also polyethylene (which may optionally be crosslinked), e.g. high-density polyethylene (HDPE), high molecular weight high density polyethylene (HDPE-HMW), ultrahigh molecular weight high-density polyethylene (HDPE-UHMW), medium-density polyethylene (MDPE), low-density polyethylene (LDPE), linear low-density polyethylene (LLDPE), (VLDPE) and (ULDPE).

Polyolefins, that is to say polymers of monoolefins, as mentioned by way of example in the above paragraph, especially polyethylene and polypropylene, can be prepared according to various processes, especially using the following methods:

a) by free radical polymerisation (usually at high pressure and high temperature).

b) by means of a catalyst, the catalyst usually containing one or more metals from group IVb, Vb, VIb or VIII. Such metals generally have one or more ligands, such as oxides, halides, alcoholates, esters, ethers, amines, alkyls, alkenyls and/or aryls, that may be either π- or σ-coordinated. Such metal complexes may be free or supported on carriers, for example on activated magnesium chloride, titanium(III) chloride, aluminium oxide or silicon oxide. The catalysts may be soluble or insoluble in the polymerisation medium. The catalysts may be active as such in the polymerisation, or further activators may be used, such as, for example, metal alkyls, metal hydrides, metal alkyl halides, metal alkyl oxides or metal alkyl oxanes, the metals being elements from group(s) Ia, IIa and/or IIIa. The activators may be modified, for example, with further ester, ether, amine or silyl ether groups. Such catalyst systems are usually termed Phillips, Standard Oil Indiana, Ziegler (-Natta), TNZ (DuPont), metallocene or Single Site Catalysts (SSC).

2. Mixtures of the polymers mentioned under 1), for example mixtures of polypropylene with polyisobutylene, polypropylene with polyethylene (e.g. PP/HDPE, PP/LDPE) and mixtures of different types of polyethylene (e.g. LDPE/HDPE).

3. Copolymers of mono- and di-olefins with one another or with other vinyl monomers, such as, for example, ethylene/propylene copolymers, linear low density polyethylene (LLDPE) and mixtures thereof with low density polyethylene (LDPE), propylene/butene-1 copolymers, propylene/isobutylene copolymers, ethylene/butene-1 copolymers, ethylene/hexene copolymers, ethylene/methylpentene copolymers, ethylene/heptene copolymers, ethylene1/octene copolymers, propylene/butadiene copolymers, isobutylene/isoprene copolymers, ethylene/alkyl acrylate copolymers, ethylene/alkyl methacrylate copolymers, ethylene/vinyl acetate copolymers and copolymers thereof with carbon monoxide, or ethylene/acrylic acid copolymers and salts thereof (ionomers), and also terpolymers of ethylene with propylene and a diene, such as hexadiene, dicyclopentadiene or ethylidenenorbornene; and also mixtures of such copolymers with one another and with polymers mentioned under 1), for example polypropylene-ethylene/propylene copolymers, LDPE-ethylene/vinyl acetate copolymers, LDPE-ethylene/acrylic acid copolymers, LLDPE-ethylene/vinyl acetate copolymers, LLDPE-ethylene/acrylic acid copolymers and alternating or random polyalkylene-carbon monoxide copolymers and mixtures thereof with other polymers, such as, for example, polyamides.

4. Hydrocarbon resins (for example $C_5$–$C_9$) including hydrogenated modifications thereof (for example tackifier resins) and mixtures of polyalkylenes and starch.

5. Polystyrene, poly(p-methylstyrene), poly(α-methylstyrene).

6. Copolymers of styrene or α-methylstyrene with dienes or acrylic derivatives, such as, for example, styrene/butadiene, styrene/acrylonitrile, styrene/alkyl methacrylate, styrene/butadiene/alkyl acrylate and methacrylate, styrene/maleic anhydride, styrene/acrylonitrile/methyl acrylate; high-impact-strength mixtures consisting of styrene copolymers and another polymer, such as, for example, a polyacrylate, a diene polymer or an ethylene/propylene/diene terpolymer; and also block copolymers of styrene, such as, for example, styrene/butadiene/styrene, styrene/isoprene/styrene, styrene/ethylene-butylene/styrene or styrene/ethylene-propylene/styrene.

7. Graft copolymers of styrene or α-methylstyrene, such as, for example, styrene on polybutadiene, styrene on polybutadiene/styrene or polybutadiene/acrylonitrile copolymers, styrene and acrylonitrile (or methacrylonitrile) on polybutadiene; styrene, acrylonitrile and methyl methacrylate on polybutadiene; styrene and maleic anhydride on polybutadiene; styrene, acrylonitrile and maleic anhydride or maleimide on polybutadiene; styrene and maleimide on polybutadiene, styrene and alkyl acrylates or alkyl methacrylates on polybutadiene, styrene and acrylonitrile on ethylene/propylene/diene terpolymers, styrene and acrylonitrile on polyalkyl acrylates or polyalkyl methacrylates, styrene and acrylonitrile on acrylate/butadiene copolymers, and mixtures thereof with the copolymers mentioned under 6), such as those known, for example, as so-called ABS, MBS, ASA or AES polymers.

8. Halogen-containing polymers, such as, for example, polychloroprene, chlorinated rubber, chlorinated and brominated copolymers of isobutylene/isoprene (halobutyl rubber) chlorinated or chlorosulfonated polyethylene, copolymers of ethylene and chlorinated ethylene, epichlorohydrin homo- and co-polymers, especially polymers of halogen-containing vinyl compounds, such as, for example, polyvinyl chloride, polyvinylidene chloride, polyvinyl fluoride, polyvinylidene fluoride; and copolymers thereof, such as vinyl chloride/vinylidene chloride, vinyl chloride/vinyl acetate or vinylidene chloride/vinyl acetate.

9. Polymers derived from α,β-unsaturated acids and derivatives thereof, such as polyacrylates and polymethacrylates, or polymethyl methacrylates, polyacrylamides and polyacrylonitriles impact-resistant-modified with butyl acrylate.

10. Copolymers of the monomers mentioned under 9) with one another or with other unsaturated monomers, such as, for example, acrylonitrile/butadiene copolymers, acrylonitrile/alkyl acrylate copolymers, acrylonitrile/alkoxyalkyl acrylate copolymers, acrylonitrile/vinyl halide copolymers or acrylonitrile/alkyl methacrylate/butadiene terpolymers.

11. Polymers derived from unsaturated alcohols and amines or their acyl derivatives or acetals, such as polyvinyl alcohol, polyvinyl acetate, stearate, benzoate or maleate, polyvinylbutyral, polyallyl phthalate, polyallylmelamine; and the copolymers thereof with olefins mentioned in Point 1.

12. Homo- and co-polymers of cyclic ethers, such as polyalkylene glycols, polyethylene oxide, polypropylene oxide, or copolymers thereof with bisglycidyl ethers.

13. Polyacetals, such as polyoxymethylene, and also those polyoxymethylenes which contain comonomers, such as, for example, ethylene oxide; polyacetals that are modified with thermoplastic polyurethanes, acrylates or MBS.

14. Polyphenylene oxides and sulfides and mixtures thereof with styrene polymers or polyamides.

15. Polyurethanes derived from polyethers, polyesters and polybutadienes having terminal hydroxy groups on the one hand and aliphatic or aromatic polyisocyanates on the other hand, and their precursors.

16. Polyamides and copolyamides derived from diamines and dicarboxylic acids and/or from aminocarboxylic acids or the corresponding lactams, such as polyamide-4, polyamide-6, polyamide-6/6, -6/10, -6/9, -6/12, -4/6, -12/12, polyamide-11, polyamide-12, aromatic polyamides derived from m-xylene, diamine and adipic acid; polyamides prepared from hexamethylenediamine and iso- and/or tere-phthalic acid and optionally an elastomer as modifier, for example poly-2,4,4-trimethylhexamethylene terephthalamide or poly-m-phenylene isophthalamide. Block copolymers of the above-mentioned polyamides with polyolefins, olefin copolymers, ionomers or chemically bonded or grafted elastomers; or with polyethers, such as, for example, with polyethylene glycol, polypropylene glycol or polytetramethylene glycol. Also polyamides or copolyamides modified with EPDM or ABS; and polyamides condensed during processing ("RIM polyamide systems").

17. Polyureas, polyimides, polyamide imides, polyether imides, polyester imides, polyhydantoins and polybenzimidazoles.

18. Polyesters derived from dicarboxylic acids and dialcohols and/or from hydroxycarboxylic acids or the corresponding lactones, such as polyethylene terephthalate, polybutylene terephthalate, poly-1,4-dimethylolcyclohexane terephthalate, polyhydroxybenzoates, and also block polyether esters derived from polyethers having terminal hydroxy groups; and also polyesters modified with polycarbonates or with MBS.

19. Polycarbonates and polyester carbonates.

20. Polysulfones, polyether sulfones and polyether ketones.

21. Crosslinked polymers derived from aldehydes on the one hand and phenols, urea or melamine on the other hand, such as phenol-formaldehyde, urea-formaldehyde and melamine-formaldehyde resins.

22. Drying and non-drying alkyd resins.

23. Unsaturated polyester resins derived from copolyesters of saturated and unsaturated dicarboxylic acids with polyhydric alcohols, and also vinyl compounds as crosslinking agents, and also the halogen-containing, difficultly combustible modifications thereof.

24. Crosslinkable acrylic resins derived from substituted acrylic acid esters, such as, for example, from epoxy acrylates, urethane acrylates or polyester acrylates.

25. Alkyd resins, polyester resins and acrylate resins crosslinked with melamine resins, urea resins, isocyanates, isocyanurates, polyisocyanates or epoxy resins.

26. Crosslinked epoxy resins derived from aliphatic, cycloaliphatic, heterocyclic or aromatic glycidyl compounds, e.g. products of diglycidyl ethers of bisphenol A, diglycidyl ethers of bisphenol F, which are crosslinked by means of customary curing agents, such as, for example, anhydrides or amines, with or without accelerators.

27. Natural polymers, such as cellulose, natural rubber, gelatin, and also the polymerhomologously chemically modified derivatives thereof, such as cellulose acetates, propionates and butyrates, and the cellulose ethers, such as methyl cellulose; and also colophonium resins and derivatives.

28. Mixtures (polyblends) of the afore-mentioned polymers, such as, for example, PP/EPDM, polyamide/EPDM or ABS, PVC/EVA, PVC/ABS, PVC/MBS, PC/ABS, PBTP/ABS, PC/ASA, PC/PBT, PVC/CPE, PVC/acrylates, POM/thermoplastic PUR, PC/thermoplastic PUR, POM/acrylate, POM/MBS, PPO/HIPS, PPO/PA 6.6 and copolymers, PA/HDPE, PA/PP, PA/PPO, PBT/PC/ABS or PBT/PET/PC.

Within the context of the present invention, inherently crosslinked polymer is to be understood as meaning also paper, especially in cardboard form, that may in addition be coated, with, for example, Teflon®. Such substrates are, for example, commercially available.

Preferably, the thermoplastic, crosslinked or inherently crosslinked plastics is a polyolefin, polyamide, polyacrylate, polycarbonate, polystyrene or an acrylic/melamine, alkyd or polyurethane surface-coating composition.

Special preference is given to polycarbonate, polyethylene, polypropylene, polyamide and polyimide.

The plastics may be in the form of films, injection-moulded articles, extruded workpieces, fibres, felts or woven fabrics.

There come into consideration as inorganic substrates especially glasses, metal oxides and metals. Such substrates may be silicates and semi-metal oxide or metal oxide glasses, preferably in the form of powders having average particle diameters of from 10 nm to 2000 $\mu$m. The particles may be either solid or porous. Examples of oxides and silicates are $SiO_2$, $TiO_2$, $ZrO_2$, MgO, NiO, $WO_3$, $Al_2O_3$, $La_2O_3$, silica gels, clays and zeolites. Preferred inorganic substrates, in addition to the metals, are silica gels, aluminium oxide, titanium oxide and glass and mixtures thereof.

In principle, all photoinitiators that contain at least one ethylenically unsaturated group are suitable for use in the process according to the invention.

There come into consideration as metal substrates especially Fe, Al, Ti, Ni, Mo, Cr or steel alloys.

The photoinitiator is preferably a compound of formula I or Ia $$(RG)-A-(IN) \tag{I}$$

$$(IN)-A-(RG')-A-(IN) \tag{Ia}$$

wherein (IN) is a photoinitiator base structure,

A is a spacer group or a single bond, (RG) denotes at least one functional ethylenically unsaturated group, and (RG') is a divalent radical that contains at least one functional ethylenically unsaturated group.

Preference is given to compounds of formula I or Ia wherein (IN) is a photoinitiator base structure of formula (II) or (III)

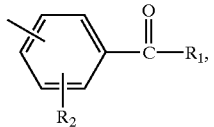
(II)

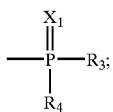
(III)

$R_1$ is a group (A), (B) or (III)

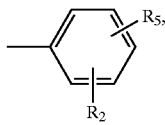
(A)

—$CR_6R_7R_8$;
(B)

$R_2$ is hydrogen, $C_1$–$C_{12}$alkyl, halogen, the group (RG)—A— or, when $R_1$ is a group (A), two $R_2$ radicals in the ortho position relative to the carbonyl group may together also denote —S—

;

$R_3$ and $R_4$ are each independently of the other $C_1$–$C_6$alkyl, $C_1$–$C_6$alkanoyl, phenyl or benzoyl, wherein the radicals phenyl or benzoyl are each unsubstituted or substituted by halogen, $C_1$–$C_6$alkyl, $C_1$–$C_6$alkylthio or $C_1$–$C_6$alkoxy;

$R_5$ is hydrogen, halogen, $C_1$–$C_{12}$alkyl or $C_1$–$C_{12}$alkoxy or the group (RG)—A—;

$R_6$ is $OR_9$ or $N(R_9)_2$ or

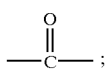
or $SO_2R_9$;

$R_7$ and $R_8$ are each independently of the other H, $C_1$–$C_{12}$alkyl, $C_2$–$C_{12}$alkenyl, $C_1$–$C_{12}$alkoxy, phenyl or benzyl or together are $C_2$–$C_6$alkylene;

$R_9$ is hydrogen, $C_1$–$C_6$alkyl or $C_1$–$C_6$alkanoyl;

$R_{10}$ is hydrogen, $C_1$–$C_{12}$alkyl or phenyl; and $X_1$ is oxygen or sulfur.

In the compounds of formula I or Ia (IN) is preferably a group

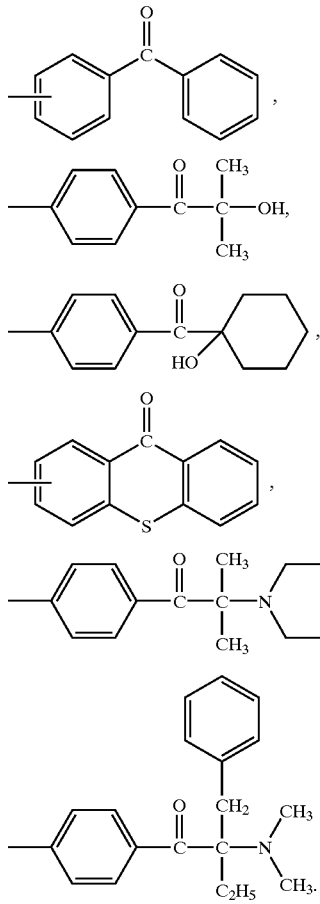

Preference is given to compounds of formula I or Ia wherein

A is a spacer group —Z—[($A_1$)$_a$—Y]$_c$—[($A_2$)$_b$—X]$_d$;

X, Y and Z are each independently of any other(s) a single bond, —O—, —S—, —N($R_{10}$)—, —(CO)—, —(CO)O—, —(CO)N($R_{10}$)—, —O—(CO)—, —N($R_{10}$)—(CO)— or —N($R_{10}$)—(CO)O—;

$A_1$ and $A_2$ are each independently of any other(s) $C_1$–$C_4$alkylene, $C_3$–$C_{12}$cycloalkylene, phenylene, phenylene-$C_1$–$C_4$alkylene or $C_1$–$C_4$alkylenephenylene-$C_1$–$C_4$alkylene;

a, b, c and d are each independently of the others a number from 0 to 4; and $R_{10}$ is as defined hereinbefore.

Special preference is given to compounds of formula I or Ia wherein A is a spacer group —Z—[($CH_2$)$_a$—Y]$_c$—[($CH_2$)$_b$—X]$_d$— and X, Y, Z, a, b, c and d are as defined hereinbefore.

In the compounds of formula I or Ia, especially preferably (RG) is $R_cR_bC$=$CR_a$—, (RG') is

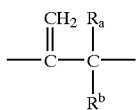

and $R_a$, $R_b$ and $R_c$ are each H or $C_1$–$C_6$alkyl, especially H or $CH_3$.

The preparation of such photoinitiator compounds is familiar to the person skilled in the art and has already been described in a large number of publications.

For example, compounds containing unsaturated groups can be prepared by the reaction of 4-[2-hydroxyethoxy)-benzoyl]-1-hydroxy-1-methyl-ethane (Irgacure® 2959, Ciba Spezialitätenchemie) with isocyanates containing acryloyl or methacryloyl groups or with other acryloyl- or methacryloyl-group-containing compounds, see, for example, U.S. Pat. No. 4,922,004.

Specific examples of suitable photoiniator compounds having an ethylenically unsaturated function, and also the preparation thereof, are to be found in the publications listed hereinbelow:

Unsaturated aceto- and benzo-phenone derivatives are described, for example, in U.S. Pat. Nos. 3,214,492, 3,429,852, 3,622,848 and 4,304,895, for example

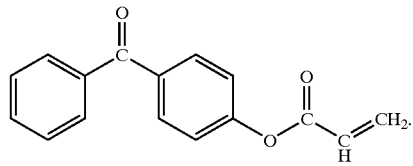

Copolymerisable, ethylenically unsaturated acetophenone compounds are to be found, for example, in U.S. Pat. No. 4,922,004, e.g.

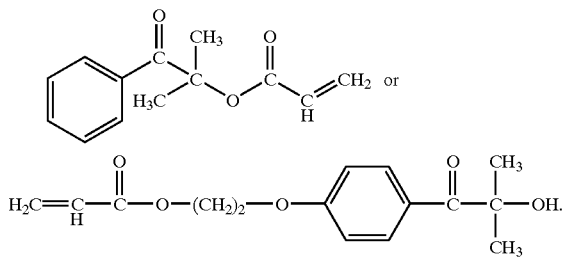

2-Acryloyl-thioxanthone is published in Eur. Polym. J. 23, 985 (1987).

Examples such as

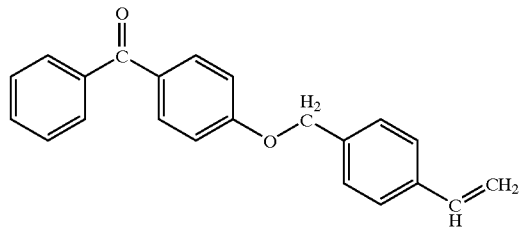

are given in DE 2 818 763.

Further photoinitiator compounds containing unsaturated carbonate groups are to be found in EP 377 191.

Uvecryl® P36, from UCB, is a benzophenone bound by ethylene oxide units to an acrylic function (see Technical Bulletin 2480/885 (1985), UCB, or New. Polym. Mat. 1, 63 (1987)):

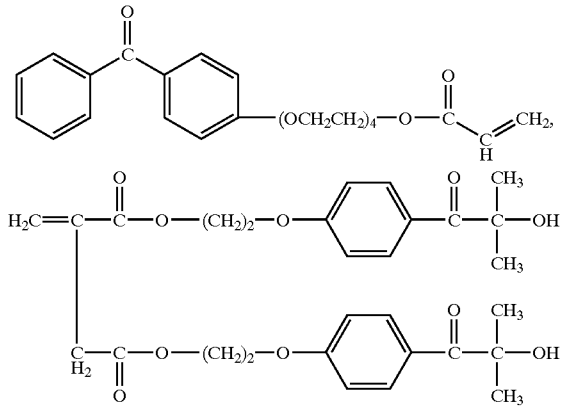

is published in Chem. Abstr. 128: 283649r.

Further suitable ethylenically unsaturated photoinitiator compounds are to be found in DE 19 501 025. Examples include 4-vinyloxycarbonyloxybenzophenone, 4-vinyloxycarbonyloxy-4'-chlorobenzophenone, 4-vinyloxycarbonyloxy-4'-methoxybenzophenone, N-vinyloxycarbonyl-4-aminobenzophenone, vinyloxycarbonyloxy-4'-fluorobenzophenone, 2-vinyloxycarbonyloxy-4'-methoxybenzophenone, 2-vinyloxycarbonyloxy-5-fluoro-4'-chlorobenzophenone, 4-vinyloxycarbonyloxyacetophenone, 2-vinyloxycarbonyloxyacetophenone, N-vinyloxycarbonyl-4-aminoacetophenone, 4-vinyloxycarbonyloxybenzil, 4-vinyloxycarbonyloxy-4'-methoxybenzil, vinyloxycarbonylbenzoin ether, 4-methoxybenzoinvinyloxycarbonyl ether, phenyl-(2-vinyloxycarbonyloxy-2-propyl)-ketone, (4-isopropylphenyl)-(2-vinyloxycarbonyloxy-2-propyl)-ketone, phenyl-(1-vinyloxycarbonyloxy)-cyclohexylketone, 2-vinyloxycarbonyloxy-9-fluorenone, 2-(N-vinyloxycarbonyl)-9-aminofluorenone, 2-vinylcarbonyloxymethylanthraquinone, 2-(N-vinyloxycarbonyl)-aminoanthraquinone, 2-vinyloxycarbonyloxythioxanthone, 3-vinylcarbonyloxythioxanthone and

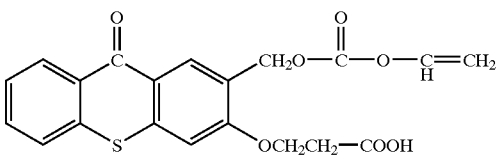

U.S. Pat. No. 4,672,079 discloses, inter alia, the preparation of 2-hydroxy-2-methyl-(4-vinylpropiophenone), 2-hydroxy-2-methyl-p-(1-methylvinyl)propiophenone, p-vinylbenzoylcyclohexanol and p-(1-methylvinyl) benzoylcyclohexanol.

Also suitable are the reaction products, described in JP Kokai Hei 2-292 307, of 4-[2-(hydroxyethoxy)-benzoyl]-1-hydroxy-1-methyl-ethane (Irgacure® 2959, Ciba Spezialitättenchemie) and isocyanates containing acryloyl or methacryloyl groups, for example

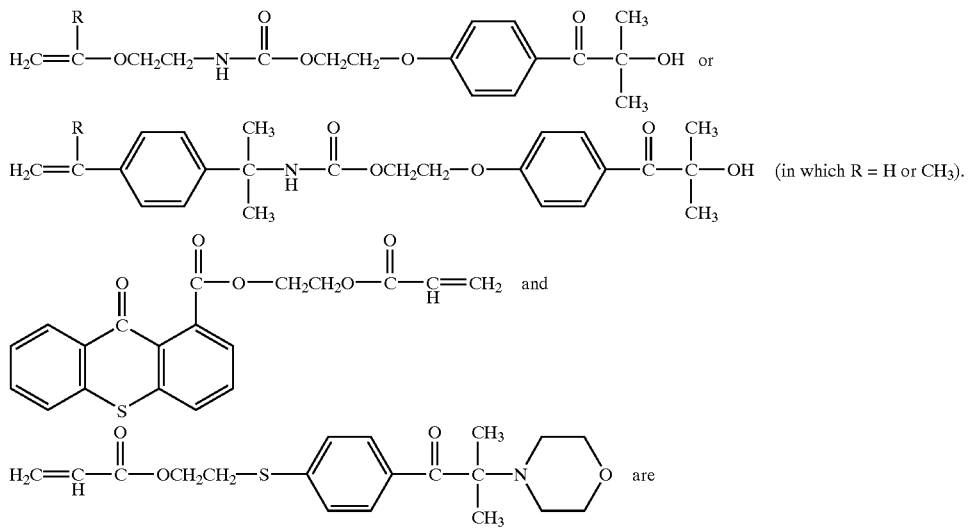

further examples of suitable photoinitiators.

The following examples are described in Radcure '86, Conference Proceedings, 4–43 to 4–54 by W. Bäumer et al.

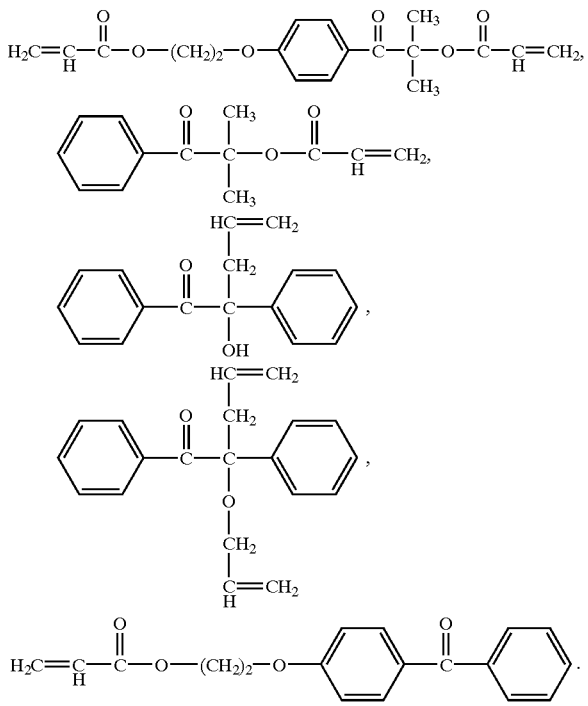

G. Wehner et al. report in Radtech '90 North America on

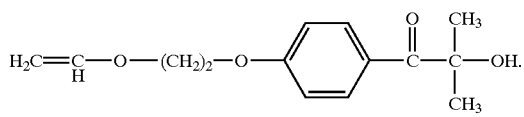

The meanings of the substituents in the various radicals are explained hereinbelow.

$C_1$–$C_{12}$Alkyl is linear or branched and is, for example, $C_1$–$C_8$-, $C_1$–$C_6$- or $C_1$–$C_4$-alkyl.

Examples are methyl, ethyl, propyl, isopropyl, n-butyl, sec-butyl, isobutyl, tert-butyl, pentyl, hexyl, heptyl, 2,4,4-trimethyl-pentyl, 2-ethylhexyl, octyl, nonyl, decyl, undecyl and dodecyl, especially, for example, methyl and butyl. $C_1$–$C_6$Alkyl and $C_1$–$C_4$alkyl are likewise linear or branched and have, for example, the meanings given above up to the corresponding number of carbon atoms. $C_1$–C6Alkyl sub stituents for benzoyl or phenyl are especially $C_1$–$C_4$alkyl, e.g. methyl or butyl.

Halogen is fluorine, chlorine, bromine or iodine, especially chlorine or bromine, preferably chlorine.

When $R_1$ is a group (A) and two $R_2$ radicals in the ortho position relative to the carbonyl group together also denote —S— or

then, for example, structures with thioxanthone base structures or anthraquinone base structures

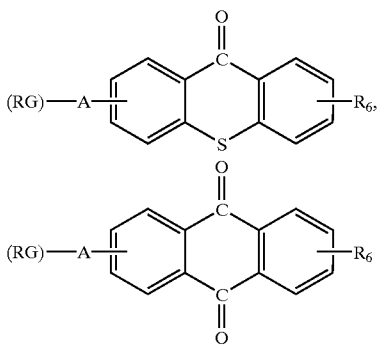

are obtained;

$C_1$–$C_6$Alkanoyl is linear or branched and is, for example, $C_1$–$C_4$alkanoyl. Examples are formyl, acetyl, propionyl, butanoyl, isobutanoyl, pentanoyl and hexanoyl, preferably acetyl. $C_1$–$C_4$Alkanoyl has the meanings given above up to the corresponding number of carbon atoms.

$C_1$–$C_{12}$Alkoxy is a linear or branched radical and is, for example, $C_1$–$C_8$-, $C_1$–$C_6$- or $C_1$–$C_4$-alkoxy. Examples are methoxy, ethoxy, propoxy, isopropoxy, n-butoxy, sec-butoxy, iso-butoxy, tert-butoxy, pentyloxy, hexyloxy, heptyloxy, 2,4,4-trimethylpentyloxy, 2-ethylhexyloxy, octyloxy, nonyloxy, decyloxy and dodecyloxy, especially methoxy, ethoxy, propoxy, isopropoxy, n-butoxy, sec-butoxy, isobutoxy, tert-butoxy, preferably methoxy.

$C_1$–$C_8$Alkoxy, $C_1$–$C_6$alkoxy and $C_1$–$C_4$alkoxy are likewise linear or branched and have, for example, the meanings given above up to the corresponding number of carbon atoms. $C_1$–$C_6$Alkylthio is a linear or branched radical and is, for example, $C_1$–$C_4$alkylthio. Examples are methylthio, ethylthio, propylthio, isopropylthio, n-butylthio, sec-butylthio, isobutylthio, tert-butylthio, pentylthio and hexylthio, especially methylthio, ethylthio, propylthio, isopropylthio, n-butylthio, sec-butylthio, isobutylthio, tert-butylthio, preferably methylthio.

$C_1$–$C_4$Alkylthio is likewise linear or branched and has, for example, the meanings given above up to the corresponding number of carbon atoms.

Phenyl or benzoyl radicals substituted by halogen, $C_1$–$C_6$alkyl, $C_1$–$C_6$alkylthio or $C_1$–$C_6$alkoxy are, for example, mono- to penta-substituted, for example mono-, di- or tri-substituted, especially di- or tri-substituted, at the phenyl ring. Preference is given, for example, to 2,4,6-trimethylbenzoyl, 2,6-dichlorobenzoyl, 2,6-dimethylbenzoyl and 2,6-dimethoxybenzoyl.

$C_1$–$C_4$Alkylene and $C_2$–$C_6$alkylene are linear or branched alkylene, for example $C_2$–$C_4$alkylene, e.g. methylene, ethylene, propylene, isopropylene, n-butylene, sec-butylene, isobutylene, tert-butylene, pentylene or hexylene. Preference is given to $C_1$–$C_4$alkylene, e.g. ethylene or butylene,

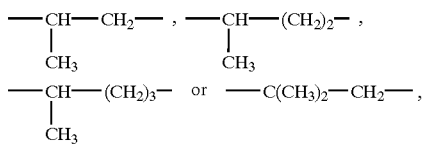

and also methylene and ethylene.

Phenylene-$C_1$–$C_4$alkylene is phenylene substituted in one position of the aromatic ring by $C_1$–$C_4$alkylene, while $C_1$–$C_4$alkylenephenylene-$C_1$–$C_4$alkylene is phenylene substituted in two positions of the phenylene ring by $C_1$–$C_4$alkylene. The alkylene radicals are in each case linear or branched and have, for example, the meanings given above up to the corresponding number of carbon atoms. Examples are

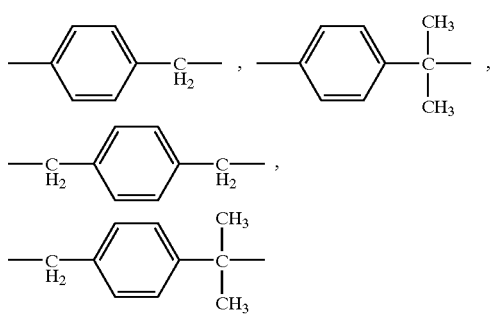

etc.

The alkylene groups may, however, also be located at other positions of the phenylene ring, for example in the 1,3-position.

Cycloalkylene is, for example, $C_3$–$C_{12}$- or $C_3$–$C_8$-cycloalkylene, for example cyclopropylene, cyclopentylene, cyclohexylene, cyclooctylene, cyclododecylene, especially cyclopentylene and cyclohexylene, preferably cyclohexylene. $C_3$–$C_{12}$Cycloalkylene, however, also denotes structural units such as

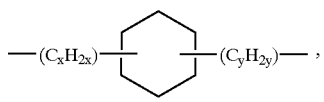

wherein x and y are each independently of the other from 0 to 6 and the sum of x and y is $\leq 6$, or

wherein x and y are each independently of the other from 0 to 7 and the sum of x and y is $\leq 7$.

Phenylene is 1,4-, 1,2- or 1,3-phenylene, especially 1,4-phenylene.

$C_2$–$C_{12}$Alkenyl radicals may be mono- or poly-unsaturated, and also linear or branched, and are, for example, $C_2$–$C_8$-, $C_2$–$C_6$- or $C_2$–$C_4$-alkenyl. Examples are allyl, methallyl, 1,1-dimethylallyl, 1-butenyl, 2-butenyl, 1,3-pentadienyl, 1-hexenyl, 1-octenyl, decenyl and dodecenyl, especially allyl.

When $R_7$ and $R_8$ together are $C_2$–$C_6$alkylene, then together with the carbon atom to which they are bonded they form a $C_3$–$C_7$cycloalkyl ring. $C_3$–$C_7$Cycloalkyl is, for example, cyclopropyl, cyclopentyl, cyclohexyl or cycloheptyl, especially cyclopentyl or cyclohexyl, preferably cyclohexyl.

$R_cR_bC=CR_a$— is, for example, —CH=CH$_2$ or —C(CH$_3$)=CH$_2$, preferably —CH=CH$_2$.

After discontinuing the free-radical-forming discharge or irradiation (process step a), the photoinitiators can be vaporised in vacuo, for example on a heatable device, with the result that they are deposited on the treated workpiece where they react with free-radical sites. The vaporisation can be carried out from a solid, a melt or using a suitable solvent, the vapour pressure of the solvent preferably being close to that of the photoinitiator.

In the case of corona discharge under atmospheric conditions, the photoinitiator can also be applied from a solution by spraying. This is preferably effected as soon as possible after the corona discharge, for example in a continuous process by means of nozzles downstream of the discharge zone.

Following the application of the photoinitiator, the workpiece can be stored or immediately further processed, a radiation-curable surface-coating layer containing ethylenically unsaturated bonds being applied by means of known technology. This can be effected by pouring, immersing, spraying, spreading, knife application, roller application or spin-coating.

The unsaturated compounds of the radiation-curable surface-coating composition may contain one or more ethylenically unsaturated double bonds. They may be low molecular weight (monomeric) or higher molecular weight (oligomeric). Examples of monomers having a double bond are alkyl and hydroxyalkyl acrylates and methacrylates, e.g. methyl, ethyl, butyl, 2-ethylhexyl and 2-hydroxyethyl acrylate, isobornyl acrylate and methyl and ethyl methacrylate. Also of interest are silicone acrylates. Further examples are acrylonitrile, acrylamide, methacrylamide, N-substituted (meth)acrylamides, vinyl esters, such as vinyl acetate, vinyl ethers, such as isobutyl vinyl ether, styrene, alkyl- and halo-styrenes, N-vinylpyrrolidone, vinyl chloride and vinylidene chloride.

Examples of monomers having a plurality of double bonds are ethylene glycol diacrylate, propylene glycol diacrylate, neopentyl glycol diacrylate, hexamethylene glycol diacrylate and bisphenol-A diacrylate, 4,4'-bis(2-acryloyloxyethoxy)diphenylpropane, trimethylolpropane triacrylate, pentaerythritol triacrylate and pentaerythritol tetraacrylate, vinyl acrylate, divinylbenzene, divinyl succinate, diallyl phthalate, triallyl phosphate, triallyl isocyanurate, tris(hydroxyethyl)isocyanurate triacrylate and tris(2-acryloylethyl)isocyanurate.

Examples of higher molecular weight (oligomeric) polyunsaturated compounds are acrylated epoxy resins, acrylated or vinyl-ether- or epoxy-group-containing polyesters, polyurethanes and polyethers. Further examples of unsaturated oligomers are unsaturated polyester resins, which are usually produced from maleic acid, phthalic acid and one or more diols and have molecular weights of about from 500 to 3000. In addition it is also possible to use vinyl ether monomers and oligomers, and also maleate-terminated oligomers having polyester, polyurethane, polyether, polyvinyl ether and epoxide main chains. Combinations of vinyl-ether-group-carrying oligomers and polymers, as described in WO 90/01512, are especially suitable, but copolymers of monomers functionalised with vinyl ether and maleic acid also come into consideration. Such unsaturated oligomers can also be termed prepolymers.

Especially suitable are, for example, esters of ethylenically unsaturated carboxylic acids and polyols or polyepoxides, and polymers having ethylenically unsaturated groups in the chain or in side groups, e.g. unsaturated polyesters, polyamides and polyurethanes and copolymers thereof, alkyd resins, polybutadiene and butadiene copolymers, polyisoprene and isoprene copolymers, polymers and copolymers having (meth)acrylic groups in side chains, and also mixtures of one or more such polymers.

Examples of unsaturated carboxylic acids are acrylic acid, methacrylic acid, crotonic acid, itaconic acid, cinnamic acid and unsaturated fatty acids such as linolenic acid or oleic acid. Acrylic and methacrylic acid are preferred.

Suitable polyols are aromatic and especially aliphatic and cycloaliphatic polyols. Examples of aromatic polyols are hydroquinone, 4,4'-dihydroxydiphenyl, 2,2-di(4-hydroxyphenyl)propane, and novolaks and resols. Examples of polyepoxides are those based on the said polyols, especially the aromatic polyols and epichlorohydrin. Also suitable as polyols are polymers and copolymers that contain hydroxy groups in the polymer chain or in side groups, e.g. polyvinyl alcohol and copolymers thereof and polymethacrylic acid hydroxyalkyl esters or copolymers thereof. Further suitable polyols are oligoesters having terminal hydroxy groups.

Examples of aliphatic and cycloaliphatic polyols include alkylenediols having preferably from 2 to 12 carbon atoms, such as ethylene glycol, 1,2- or 1,3-propanediol, 1,2-, 1,3- or 1,4-butanediol, pentanediol, hexanediol, octanediol, dodecanediol, diethylene glycol, triethylene glycol, polyethylene glycols having molecular weights of preferably from 200 to 1500, 1,3-cyclopentanediol, 1,2-, 1,3- or 1,4-cyclohexanediol, 1,4-dihydroxymethylcyclohexane, glycerol, tris(β-hydroxyethyl)amine, trimethylolethane, trimethylolpropane, pentaerythritol, dipentaerythritol and sorbitol.

The polyols may be partially or fully esterified with one or with different unsaturated carboxylic acid(s), it being possible for the free hydroxy groups in partial esters to be modified, for example etherified, or esterified with other carboxylic acids.

Examples of esters are:

trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetramethacrylate, sorbitol pentaacrylate, sorbitol hexaacrylate, oligoester acrylates and methacrylates, glycerol di- and tri-acrylate, 1,4-cyclohexane diacrylate, bisacrylates and bismethacrylates of polyethylene glycol having a molecular weight of from 200 to 1500, and mixtures thereof.

Also suitable as components are the amides of identical or different unsaturated carboxylic acids and aromatic, cycloaliphatic and aliphatic polyamines having preferably from 2 to 6, especially from 2 to 4, amino groups. Examples of such polyamines are ethylenediamine, 1,2- or 1,3-propylenediamine, 1,2-, 1,3- or 1,4-butylenediamine, 1,5-pentylenediamine, 1,6-hexylenediamine, octylenediamine, dodecylenediamine, 1,4-diaminocyclohexane, isophoronediamine, phenylenediamine, bisphenylenediamine, di-β-aminoethyl ether, diethylenetriamine, triethylenetetramine and di(βaminoethoxy)- and di(β-aminopropoxy)-ethane. Further suitable polyamines are polymers and copolymers which may have additional amino groups in the side chain and oligoamides having terminal amino groups. Examples of such unsaturated amides are: methylene bisacrylamide, 1,6-hexamethylene bisacrylamide, diethylenetriamine trismethacrylamide, bis(methacrylamidopropoxy)ethane, β-methacrylamidoethyl methacrylate and N-[(β-hydroxyethoxy)ethyl]-acrylamide.

Suitable unsaturated polyesters and polyamides are derived, for example, from maleic acid and diols or diamines. The maleic acid may have been partially replaced by other dicarboxylic acids. They may be used together with ethylenically unsaturated comonomers, e.g. styrene. The polyesters and polyamides may also be derived from dicarboxylic acids and ethylenically unsaturated diols or diamines, especially from those having longer chains of e.g. from 6 to 20 carbon atoms. Examples of polyurethanes are those composed of saturated diisocyanates and unsaturated diols or unsaturated diisocyanates and saturated diols.

Polybutadiene and polyisoprene and copolymers thereof are known. Suitable comonomers include, for example, olefins, such as ethylene, propene, butene, hexene, (meth) acrylates, acrylonitrile, styrene and vinyl chloride. Polymers having (meth)acrylate groups in the side chain are likewise known. Examples are reaction products of novolak-based epoxy resins with (meth)acrylic acid; homo- or co-polymers of vinyl alcohol or hydroxyalkyl derivatives thereof that have been esterified with (meth)acrylic acid; and homo- and co-polymers of (meth)acrylates that have been esterified with hydroxyalkyl (meth)acrylates.

There is especially preferably used as ethylenically mono- or poly-unsaturated compound an acrylate or methacrylate compound. More especially preferred are polyunsaturated acrylate compounds as already listed hereinabove.

Special preference is given to a process in which at least one of the ethylenically unsaturated monomers or oligomers of the radiation-curable composition is a mono-, di-, tri- or tetra-functional acrylate or methacrylate.

Preferably, the composition comprises, in addition to at least one ethylenically unsaturated monomer or oligomer, at least one further photoinitiator or coinitiator for the curing by UV/VIS radiation. UV/VIS radiaton within the context of the present invention is to be understood as electromagnetic radiation in the wavelength range from 250 nm to 450 nm. The range from 305 nm to 450 nm is preferred. Suitable lamps are known to the person skilled in the art and are available commercially.

Compounds of formula I or Ia or any other initiator known from the prior art may be used as photoinitiator in the radiation-curable surface-coating compositions.

Typical examples, which can be used either individually or in the form of mixtures with one another, are mentioned hereinbelow. For example benzophenones, benzophenone derivatives, acetophenone, acetophenone derivatives, for example α-hydroxycycloalkylphenylketones or 2-hydroxy-2-methyl-1-phenylpropanone, dialkoxyacetophenones, α-hydroxy- or α-amino-acetophenones, for example (4-methylthiobenzoyl)-1-methyl-1-morpholino-ethane, (4-morpholinobenzoyl)-1-benzyl-1-dimethylaminopropane, 4-aroyl-1,3-dioxolanes, benzoin alkyl ethers and benzil ketals, for example benzil dimethyl ketal, phenyl glyoxalates and derivatives thereof, dimeric phenyl glyoxalates, monoacylphosphine oxides, for example (2,4,6-trimethylbenzoyl) phenylphosphine oxide, bisacylphosphine oxides, for example bis(2,6-dimethoxybenzoyl)-(2,4,4-trimethylpent-1-yl)phosphine oxide, bis(2,4,6-trimethylbenzoyl) phenylphosphine oxide or bis(2,4,6-trimethylbenzoyl)-(2,4-dipentyloxyphenyl)phosphine oxide, trisacylphosphine oxides, ferrocenium compounds or titanocenes, for example dicyclopentadienyl-bis(2,6-difluoro-3-pyrrolophenyl) titanium. A further class of suitable photoinitiators is that of the oxime esters. The following compounds are mentioned by way of example: 1-(4-phenylsulfanylphenyl)-butane-1,2-dione 2-oxime-O-benzoate, 1-(4-phenylsulfanylphenyl)-octane-1,2-dione 2-oxime-O-benzoate, 1-(4-phenylsulfanylphenyl)octan-1-one oxime-O-acetate, 1-(4-phenylsulfanylphenyl)-butan-1-one oxime-O-acetate and 1-(4-phenylsulfanylphenyl)-octane-1,2-dione 2-oxime-O-benzoate.

As co-initiators there come into consideration, for example, sensitisers that shift or broaden the spectral sensitivity and as a result cause an acceleration of the photopolymerisation. Such sensitisers are especially aromatic carbonyl compounds, such as, for example, benzophenone derivatives, thioxanthone derivatives, especially also isopropylthioxanthone, anthraquinone derivatives and 3-acylcoumarin derivatives, terphenyls, styrylketones, as well as 3-(aroylmethylene)-thiazolines, camphorquinone, and also eosin, rhodamine and erythrosine dyes.

When the photoinitiator layer grafted on according to the invention consists of a benzophenone or benzophenone derivative, for example amines may also come into consideration as photosensitisers.

The following are further examples of photosensitisers:
1. Thioxanthones

Thioxanthone, 2-isopropylthioxanthone, 2-chlorothioxanthone, 2-dodecylthioxanthone, 2,4-diethylthioxanthone, 2,4-dimethylthioxanthone, 1-methoxycarbonylthioxanthone, 2-ethoxycarbonylthioxanthone, 3-(2-methoxyethoxycarbonyl)-thioxanthone, 4-butoxycarbonylthioxanthone, 3-butoxycarbonyl-7-methylthioxanthone, 1-cyano-3-chlorothioxanthone, 1-ethoxycarbonyl-3-chlorothioxanthone, 1-ethoxycarbonyl-3-ethoxythioxanthone, 1-ethoxycarbonyl-3-aminothioxanthone, 1-ethoxycarbonyl-3-phenylsulfurylthioxanthone, 3,4-di[2-(2-methoxyethoxy) ethoxycarbonyl]thioxanthone, 1-ethoxycarbonyl-3-(1-methyl-1-morpholinoethyl)-thioxanthone, 2-methyl-6-dimethoxymethyl-thioxanthone, 2-methyl-6-(1,1-dimethoxybenzyl)-thioxanthone, 2-morpholinomethylthioxanthone, 2-methyl-6-morpholinomethylthioxanthone, N-allylthioxanthone-3,4-dicarboximide, N-octylthioxanthone-3,4-dicarboximide, N-(1,1,3,3-tetramethylbutyl)-thioxanthone-3,4-dicarboximide, 1-phenoxythioxanthone, 6-ethoxycarbonyl-2-methoxythioxanthone, 6-ethoxycarbonyl-2-methylthioxanthone, thioxanthone-2-polyethylene glycol ester, 2-hydroxy-3-(3,4-dimethyl-9-oxo-9H-thioxanthon-2-yloxy)-N,N,N-trimethyl-1-propanaminium chloride;

2. Benzophenones

Benzophenone, 4-phenylbenzophenone, 4-methoxybenzophenone, 4,4'-dimethoxybenzophenone, 4,4'-dimethylbenzophenone, 4,4'-dichlorobenzophenone, 4,4'-dimethylaminobenzophenone, 4,4'-diethylaminobenzophenone, 4-methylbenzophenone, 2,4,6-trimethylbenzophenone, 4-(4-methylthiophenyl)-benzophenone, 3,3'-dimethyl-4-methoxybenzophenone, methyl-2-benzoylbenzoate, 4-(2-hydroxyethylthio)-benzophenone, 4-(4-tolylthio)-benzophenone, 4-benzoyl-N, N, N-trimethylbenzenemethanaminium chloride, 2-hydroxy-3-(4-benzoylphenoxy)-N,N,N-trimethyl-1-propanaminium chloride monohydrate, 4-(13-acryloyl-1,4,7,10,13-pentaoxatridecyl)-benzophenone, 4-benzoyl-N,N-dimethyl-N-[2-(1-oxo-2-propenyl)oxy]ethyl-benzenemethanaminium chloride;

3. 3-Acylcoumarins

3-Benzoylcoumarin, 3-benzoyl-7-methoxycoumarin, 3-benzoyl-5,7-di(propoxy)coumarin, 3-benzoyl-6,8-dichlorocoumarin, 3-benzoyl-6-chlorocoumarin, 3,3'-carbonyl-bis[5,7-di(propoxy)-coumarin], 3,3'-carbonyl-bis(7-methoxycoumarin), 3,3'-carbonyl-bis(7-diethylamino-coumarin), 3-isobutyroylcoumarin, 3-benzoyl-5,7-dimethoxycoumarin, 3-benzoyl-5,7-diethoxycoumarin, 3-benzoyl-5,7-dibutoxycoumarin, 3-benzoyl-5,7-di(methoxyethoxy)coumarin, 3-benzoyl-5,7-di(allyloxy)-coumarin, 3-benzoyl-7-dimethylaminocoumarin, 3-benzoyl-7-diethylaminocoumarin, 3-isobutyroyl-7-dimethylaminocoumarin, 5,7-dimethoxy-3-(1-naphthoyl)-coumarin, 5,7-dimethoxy-3-(1-naphthoyl)-coumarin, 3-benzoylbenzo[f]coumarin, 7-diethylamino-3-thienoylcoumarin, 3-(4-cyanobenzoyl)-5,7-dimethoxycoumarin;

4. 3-(Aroylmethylene)-thiazolines

3-Methyl-2-benzoylmethylene-β-naphthothiazoline, 3-methyl-2-benzoylmethylene-benzothiazoline, 3-ethyl-2-propionylmethylene-β-naphthothiazoline;

5. Other carbonyl compounds

Acetophenone, 3-methoxyacetophenone, 4-phenylacetophenone, benzil, 2-acetylnaphthalene, 2-naphthaldehyde, 9,10-anthraquinone, 9-fluorenone, dibenzosuberone, xanthone, 2,5-bis(4-diethylaminobenzylidene)cyclopentanone, α-(para-dimethylaminobenzylidene)-ketones, such as 2-(4-dimethylaminobenzylidene)-indan-1-one or 3-(4-dimethylaminophenyl)-1-indan-5-ylpropenone, 3-phenylthiophthalimide, N-methyl-3,5-di(ethylthio)phthalimide, N-methyl-3,5-di(ethylthio)phthalimide.

In addition to those additives, which are important for curing the surface-coating composition, further additives, especially light stabilisers, may be present in the radiation-curable composition.

With suitable selection of the photoinitiators, the surface-coating compositions can also be pigmented, for which both colour pigments and white pigments can be used.

The surface-coating compositions can be applied in layer thicknesses of from approximately 1 μm to approximately 100 μm, preferably approximately from 1 μm to 40 μm. In the range of low layer thicknesses of <5 μm, pigmented surface-coating compositions are also referred to as printing inks.

It is possible to add as light stabilisers UV absorbers such as, for example, those of the hydroxyphenylbenzotriazole, hydroxyphenylbenzophenone, oxalic acid amide or hydroxyphenyl-s-triazine type. Such compounds can be used on their own or in the form of mixtures, with or without the use of sterically hindered amines (HALS).

The following are examples of such UV absorbers and light stabilisers:

1. 2-(2'-Hydroxyphenyl)-benzotriazoles, e.g. 2-(2'-hydroxy-5'-methylphenyl)-benzotriazole, 2-(3',5'-di-tert-butyl-2'-hydroxyphenyl)-benzotriazole, 2-(5'-tert-butyl-2'-hydroxyphenyl)-benzotriazole, 2-(2'-hydroxy-5'-(1,1,3,3-tetramethylbutyl)phenyl)-benzotriazole, 2-(3',5'-di-tert-butyl-2'-hydroxyphenyl)-5-chlorobenzotriazole, 2-(3'-tert-butyl-2'-hydroxy-5'-methylphenyl)-5-chlorobenzotriazole, 2-(3'-sec-butyl-5'-tert-butyl-2'-hydroxyphenyl)-benzotriazole, 2-(2'-hydroxy-4'-octyloxyphenyl)-benzotriazole, 2-(3',5'-di-tert-amyl-2'-hydroxyphenyl)-benzotriazole, 2-(3',5'-bis(α,α-dimethylbenzyl)-2'-hydroxyphenyl)-benzotriaxole, mixture of 2-(3'-tert-butyl-2'-hydroxy-5'-(2-octyloxycarbonylethyl)phenyl)-5-chlorobenzotriazole, 2-(3'-tert-butyl-5'-[2-(2-ethylhexyloxy)-carbonylethyl]-2'-hydroxyphenyl)-5-chlorobenzotriazole, 2-(3'-tert-butyl-2'-hydroxy-5'-(2-methoxycarbonylethyl)phenyl)-5-chlorobenzotriazole, 2-(3'-tert-butyl-2'-hydroxy-5'-(2-methoxycarbonylethyl)phenyl)-benzotriazole, 2-(3'-tert-butyl-2'-hydroxy-5'-(2-octyloxycarbonylethyl)phenyl)-benzotriazole, 2-(3'-tert-butyl-5'-[2-(2-ethylhexyloxy)-carbonylethyl]-2'-hydroxyphenyl)-benzotriazole, 2-(3'-dodecyl-2'-hydroxy-5'-methylphenyl)-benzotriazole and 2-(3'-tert-butyl-2'-hydroxy-5'-(2-isooctyloxycarbonylethyl)phenyl-benzotriazole, 2,2'-methylene-bis[4-(1,1,3,3-tetramethylbutyl)-6-benzotriazol-2-yl-phenol]; the transesterification product of 2-[3'-tert-butyl-5'-(2-methoxycarbonylethyl)-2'-hydroxyphenyl]-benzotriazole with polyethylene glycol 300; [R—CH₂CH₂—COO(CH₂)₃]₂— wherein R=3'-tert-butyl-4'-hydroxy-5'-2H-benzotriazol-2-yl-phenyl.

2. 2-Hydroxybenzophenones, e.g. the 4-hydroxy, 4-methoxy, 4-octyloxy, 4-decyloxy, 4-dodecyloxy, 4-benzyloxy, 4,2',4'-trihydroxy or 2'-hydroxy4,4'-dimethoxy derivative.

3. Esters of unsubstituted or substituted benzoic acids, e.g. 4-tert-butyl-phenyl salicylate, phenyl salicylate, octylphenyl salicylate, dibenzoylresorcinol, bis(4-tert-butylbenzoyl)-resorcinol, benzoylresorcinol, 3,5-di-tert-butyl-4-hydroxybenzoic acid 2,4-di-tert-butylphenyl ester, 3,5-di-tert-butyl-4-hydroxybenzoic acid hexadecyl ester, 3,5-di-tert-butyl-4-hydroxybenzoic acid octadecyl ester and 3,5-di-tert-butyl-4-hydroxybenzoic acid 2-methyl-4,6-di-tert-butylphenyl ester.

4. Acrylates, e.g. α-cyano-β,β-diphenylacrylic acid ethyl ester or isooctyl ester, α-methoxycarbonylcinnamic acid methyl ester, α-cyano-β-methyl-p-methoxycinnamic acid methyl ester or butyl ester, α-methoxycarbonyl-p-methoxycinnamic acid methyl ester and N-(β-methoxycarbonyl-β-cyanovinyl)-2-methyl-indoline.

5. Sterically hindered amines, e.g. bis(2,2,6,6-tetramethylpiperidyl)sebacate, bis(2,2,6,6-tetramethylpiperidyl)succinate, bis(1,2,2,6,6-pentamethylpiperidyl)sebacate, n-butyl-3,5-di-tert-butyl-4-hydroxybenzylmalonic acid bis(1,2,2,6,6-pentamethylpiperidyl) ester, the condensation product of 1-hydroxyethyl-2,2,6,6-tetramethyl4-hydroxypiperidine and succinic acid, the condensation product of N,N'-bis(2,2,6,6-tetramethyl-4-piperidyl)hexamethylenediamine and 4-tert-octylamino-2,6-dichloro-1,3,5-s-triazine, tris(2,2,6,6-tetramethyl-4-piperidyl)nitrilotriacetate, tetrakis(2,2,6,6-tetramethyl-4-piperidyl)-1,2,3,4-butanetetraoate, 1,1'-(1,2-ethanediyl)-bis(3,3,5,5-tetramethylpiperazinone), 4-benzoyl-2,2,6,6-tetramethylpiperidine, 4-stearyloxy-2,2,6,6-tetramethylpiperidine, bis(1,2,2,6,6-pentamethylpiperidyl)-2-n-butyl-2-(2-hydroxy-3,5-di-tert-butylbenzyl)-malonate, 3-n-octyl-7,7,9,9-tetramethyl-1,3,8-triazaspiro[4.5]decane-2,4-dione, bis(1-octyloxy-2,2,6,6-tetramethylpiperidyl)sebacate, bis(1-octyloxy-2,2,6,6- tetramethylpiperidyl)succinate, the condensation product of N,N'-bis(2,2,6,6-tetramethyl-4-piperidyl) hexamethylenediamine and 4-morpholino-2,6-dichloro-1,3, 5-triazine, the condensation product of 2-chloro-4,6-di(4-n-butylamino-2,2,6,6-tetramethylpiperidyl)-1,3,5-triazine and 1,2-bis(3-aminopropylamino)ethane, the condensation product of 2-chloro-4,6-di(4-n-butylamino-1,2,2,6,6-pentamethylpiperidyl)-1,3,5-triazine and 1,2-bis(3-aminopropylamino)ethane, 8-acetyl-3-dodecyl-7,7,9,9-tetramethyl-1,3,8-triazaspiro[4.5]decane-2,4-dione, 3-dodecyl-1-(2,2,6,6-tetramethyl-4-piperidyl)-pyrrolidine-2,5-dione and 3-dodecyl-1-(1,2,2,6,6-pentamethyl-4-piperidyl)-pyrrolidine-2,5-dione.

6. Oxalic acid diamides, e.g. 4,4'-dioctyloxy-oxanilide, 2,2'-diethoxy-oxanilide, 2,2'-dioctyloxy-5,5'-di-tert-butyl oxanilide, 2,2'-didodecyloxy-5, 5'-di-tert-butyl oxanilide, 2-ethoxy-2'-ethyl oxanilide, N,N'-bis(3-dimethylaminopropyl)oxalamide, 2-ethoxy-5-tert-butyl-2'-ethyl oxanilide and a mixture thereof with 2-ethoxy-2'-ethyl-5,4'-di-tert-butyl oxanilide and mixtures of o- and p-methoxy- and of o- and p-ethoxy-disubstituted oxanilides.

7. 2-(2-Hydroxyphenyl)-1,3,5-triazines, e.g. 2,4,6-tris(2-hydroxy-4-octyloxyphenyl)-1,3,5-triazine, 2-(2-hydroxy-4-octyloxyphenyl)-4,6-bis(2,4-dimethylphenyl)-1,3,5-triazine, 2-(2,4-dihydroxyphenyl)-4,6-bis(2,4-dimethylphenyl)-1,3,5-triazine, 2,4-bis(2-hydroxy-4-propyloxyphenyl)-6-(2,4-dimethylphenyl)-1,3,5-triazine, 2-(2-hydroxy-4-octyloxyphenyl)-4,6-bis(4-methylphenyl)-1,3,5-triazine, 2-(2-hydroxy-4-dodecyloxyphenyl)-4,6-bis(2,4-dimethylphenyl)-1,3,5-triazine, 2-[2-hydroxy-4-(2-hydroxy-3-butyloxy-propyloxy)-phenyl]-4,6-bis(2,4-dimethylphenyl)-1,3,5-triazine, 2-[2-hydroxy-4-(2-hydroxy-3-octyloxy-propyloxy)-phenyl]4,6-bis(2, 4dimethylphenyl)-1,3,5-triazine and 2-[4-dodecyloxy/tridecyloxy-(2-hydroxypropyl)oxy-2-hydroxyphenyl]-4,6-bis(2,4-dimethylphenyl)-1,3,5-triazine.

In addition to the above-mentioned light stabilisers, further stabilisers, such as phosphites or phosphonites, are also suitable.

8. Phosphites and phosphonites, e.g. triphenyl phosphite, diphenylalkyl phosphites, phenyldialkyl phosphites, tris(nonylphenyl)phosphite, trilauryl phosphite, trioctadecyl phosphite, distearyl-pentaerythritol diphosphite, tris(2,4-di-tert-butylphenyl)phosphite, diisodecylpentaerythritol diphosphite, bis(2,4-di-tert-butylphenyl)pentaerythritol diphosphite, bis(2,6-di-tert-butyl-4-methylphenyl) pentaerythritol diphosphite, bis-isodecyloxy-pentaerythritol diphosphite, bis(2,4-di-tert-butyl-6-methylphenyl) pentaerythritol diphosphite, bis(2,4,6-tri-tert-butylphenyl) pentaerythritol diphosphite, tristearyl sorbitol triphosphite, tetrakis(2,4-di-tert-butylphenyl)-4,4'-biphenylene diphosphonite, 6-isooctyloxy-2,4,8,10-tetra-tert-butyl-12H-dibenzo[d,g]-1,3,2-dioxaphosphocine, 6-fluoro-2,4,8,10-tetra-tert-butyl-12-methyl-dibenzo[d,g]-1,3,2-dioxaphosphocine, bis(2,4-di-tert-butyl-6-methylphenyl) methyl phosphite and bis(2,4-di-tert-butyl-6-methylphenyl) ethyl phosphite.

Additives customary in the art, such as, for example, antistatics, flow improvers and adhesion promoters, can also be used.

When the strongly adherent layer applied is a metal, metal oxide or semi-metal oxide layer, the metals concerned are preferably as follows: gold, silver, chromium, molybdenum, aluminium and copper, especially aluminium and copper. Also preferred are the following semi-metal oxides and metal oxides: aluminium oxide, chromium oxide, iron oxide, copper oxide and silicon oxide.

The metals, semi-metal oxides and metal oxides are vaporised under vacuum conditions and deposited in the presence of UV light on the substrate precoated with photoinitiator. The crucible temperatures for the vaporisation process depend on the metal used and are preferably from 300 to 2000° C., especially from 800 to 1800° C.

The UV radiation during the deposition can be generated, for example, by an anodic arc.

The metal-coated substrates are suitable for diffusion barrier layers or electromagnetic screens or they form decorative elements.

Preferably, process step a) is carried out with a low-temperature plasma discharge.

The process can be performed within a wide pressure range; as pressure increases, the discharge characteristic shifts from pure low-temperature plasma towards corona discharge and ultimately, at atmospheric pressure of approximately from 1000 to 1100 mbar, changes over to a pure corona discharge.

Preferably, the process is carried out at a process pressure of from $10^{-6}$ mbar up to atmospheric pressure (1013 mbar), especially preferably in the range from $10^{-4}$ to $10^{-2}$ mbar as a plasma process, and at atmospheric pressure as a corona process.

The process is preferably carried out using as plasma gas an inert gas or a mixture of an inert gas with a reactive gas.

It is especially preferable to use as plasma gases He, Ar, Kr, Xe, $N_2$, $O_2$ and $H_2O$ on their own or in the form of a mixture.

The temperature at which the photoinitiator is vaporised in vacuo is preferably from 20° C. to 250° C., especially from 40° C. to 150° C.

Preferably, the deposited photoinitiator layer has a thickness ranging from that of a monomolecular layer up to 100 nm, especially from 10 nm to 60 nm.

Preferably, the plasma treatment of the inorganic or organic substrate a) is carried out for from 1 second to 300 seconds, especially from 10 seconds to 200 seconds.

The deposition of the photoinitiator in process step b) is carried out in vacuo, preferably for from 1 second to 10 minutes.

When a corona discharge is carried out, a solution or melt of the photoinitiator is preferably applied by spraying immediately following the discharge zone. The corona discharge can also be carried out under a protective gas atmosphere.

When the substrate has been pretreated with a plasma or corona discharge or by irradiating with high-energy radiation, the further processing time depends on the lifespan of the free radicals formed on the surface. Basically, it is advantageous to apply the photoinitiator as quickly as possible, since at the beginning a high number of reactive free radicals are present on the surface for the grafting reaction. It may, however, also be acceptable for many purposes for reaction step b) to be carried out after a time delay, but preferably process step b) is carried out immediately after, or within 10 hours of, process step a).

The invention relates also to the use of photoinitiators comprising one or more ethylenically unsaturated groups in a process for the production of strongly adherent coatings on an inorganic or organic substrate that comprises, in a first step a) subjecting the inorganic or organic substrate to the action of a low-temperature plasma discharge, a corona discharge, high-energy UV radiation or electron radiation, then discontinuing the radiation or discharge; in a further step b) under vacuum or at normal pressure, applying one or more photoinitiators containing at least one ethylenically unsaturated group to the inorganic or organic substrate, and allowing reaction with the free-radical sites formed there; and c1) coating the substrate so precoated with photoinitiator with a composition comprising at least one ethylenically unsaturated monomer or oligomer, and curing the coating by means of UV/VIS radiation or c2) depositing a metal, semi-metal oxide or metal oxide from the gaseous phase, in the presence of UV light, on the substrate so precoated with photoinitiator.

The invention relates also to strongly adherent coatings obtainable in accordance with the process described above.

Such strongly adherent coatings are important both as protective layers or coverings (it being possible for such coatings in addition to be pigmented), and for image-forming coatings, such as, for example, in resist technology.

The following Examples illustrate the invention.

EXAMPLE 1

The plasma treatment is carried out in a commercially available parallel plate reactor at 40 kHz.

The substrate used is a 3 mm thick mass-produced plastics component made of PP/EPDM which has been so modified that one half is hard and the other is soft.

Such a substrate is exposed to an argon plasma for 20 seconds at $3.10^{-2}$ mbar and a further substrate is exposed to an argon/$O_2$ plasma (75/25), the substrates each being so arranged on a holder that only one side is exposed to the plasma. The plasma is discontinued and the pressure is lowered to $2.10^{-4}$ mbar. In the plasma chamber, the photoinitiator of the following structural formula

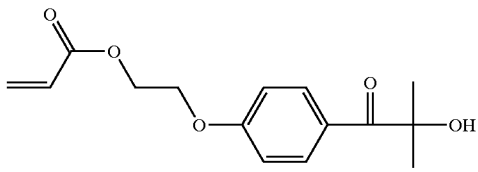

is vaporised at from 50 to 52° C. for 180 seconds in a heatable crucible, a layer thickness of approximately 30 nm being obtained. The thickness is measured using a commercially available quartz oscillator.

The substrate so precoated is immersed in a radiation-curable epoxy acrylate composition consisting of 89% Ebecryl® 604 (UCB), 10% SR® 344 (Sartomer), 1% Ebecryl® 350 (UCB) and 2% Darocur® 1173 (Ciba Spezialitätenchemie).

The immersed specimens are cured on both sides at a belt speed of 3 m/min, one after the other, in an AETEK processor having two 80 W/cm² medium-pressure mercury lamps.

The strength of adhesion is determined by cross cutting and peeling off adhesive tape.

In both specimens, the coating is peeled off completely from the underside, which has no photoinitiator layer.

On the side pretreated with photoinitiator, only minimal fragments are removed at the cross cuts, the adhesion on the soft and hard segments of the specimens being equally good. The specimen that has been exposed to an argon/$O_2$ plasma exhibits a slightly better adhesion result.

After 10 days exposure to sunlight the adhesion values remain excellent.

EXAMPLE 2

The substrate used is a 1 mm thick Teflon® sheet. Plasma conditions and photoinitiator correspond to those in Example 1. The surface-coating composition from Example 1 is applied by knife application in a thickness of 30 μm.

In both specimens, the coating is peeled off completely from the underside, which has no photoinitiator layer.

On the side pretreated with photoinitiator, only minimal fragments are peeled of at the cross cuts; the adhesion is excellent. The specimen that has been exposed to an argon/$O_2$ plasma exhibits a slightly better adhesion result.

EXAMPLE 3

Copper Coating on PTFE

The substrate used is a 5 mm thick Teflon® sheet. Plasma conditions and photoinitiator correspond to those in Example 1.

After application of the photoinitiator layer, in the same reactor a copper layer is deposited in an anodic arc procedure (VALICO procedure) at a pressure of $2.10^{-4}$ mbar. The crucible temperature is from 1500 to 1600° C. A layer 1 μm thick is deposited in the course of one minute.

The copper layer cannot be removed from the substrate by the adhesive tape peel test.

EXAMPLE 4

Pretreatment with Vacuum UV

In a vacuum chamber, various polymer sheets are irradiated for 2 minutes with short-wave UV light having a wavelength of 172 nm. For the irradiation, an excimer lamp (Excivac®, Heraeus Nobellight, Kleinostheim) is used, and the pressure in the chamber is $3.10^{-2}$ mbar. During the irradiation with excimer rays, one half of the sheet is covered on both sides with an aluminium foil, with the result that no free radicals are generated in those areas. When the irradiation is complete, the pressure is lowered to $8.10^{-4}$ mbar and, in a heatable crucible, the photoinitiator from Example 1 is vaporised for 2 minutes at a temperature of up to 120° C. The coated substrates are coated with the radiation-curable formulation from Example 1 by brush application. The specimens are cured at a belt speed of 10 m/min in an AETEK processor having two 80 W/cm² medium-pressure mercury lamps. The strength of adhesion is determined by cross cutting.

Where the substrate is a polypropylene sheet, a slightly increased adhesion of the surface-coating film is achieved on the irradiated and vapour-deposited area, whereas there is no adhesion on the non-irradiated and non-vapour-deposited side. Similarly, there is no adhesion on sheets that are irradiated only.

Where the substrate is a polyester sheet (Mylar® DuPont, 100 μm), the adhesion of the surface-coating film on the irradiated and vapour-deposited area is very good (the layer cannot be removed), whereas on the untreated area the surface-coating can easily be peeled off. An insignificant increase in adhesion is achieved on films that have been irradiated only.

What is claimed is:

1. A process for the production of adherent coatings on an inorganic or organic substrate that comprises, in a first step a) subjecting the inorganic or organic substrate to the action of a low-temperature plasma discharge, a corona discharge, high-energy UV radiation or electron radiation, then discontinuing the radiation or discharge; in a further step b) under vacuum or at normal pressure, applying one or more photoinitiators containing at least one ethylenically unsaturated group to the inorganic or organic substrate, and allowing reaction with the free-radical sites formed in step a); and c1) coating the substrate so precoated with photoinitiator with a composition comprising at least one ethylenically unsaturated monomer or oligomer, and curing the coating by means of UV/VIS radiation or c2) depositing a metal, semi-metal oxide or metal oxide from the gaseous phase, in the presence of UV light, on the substrate so precoated with photoinitiator.

2. A process according to claim 1, wherein the inorganic or organic substrate is in the form of a powder, a fibre, a film or a three-dimensional workpiece.

3. A process according to claim 1, wherein the inorganic or organic substrate is a thermoplastic, elastomeric, inherently crosslinked or crosslinked polymer, a metal oxide, a glass or a metal.

4. A process according to claim 1, wherein the photoinitiator is a compound of formula I or Ia $$(RG)—A—(IN) \quad (I),$$

$$(IN)—A—(RG')—A—(IN) \quad (Ia),$$

wherein (IN) is a photoinitiator base structure,

A is a spacer group or a single bond, (RG) denotes at least one functional ethylenically unsaturated group, and (RG') is a divalent radical that contains at least one functional ethylenically unsaturated group.

5. A process according to claim 4, wherein in the compounds of formula I or Ia (IN) is a photoinitiator base structure of formula (II) or (III)

(II)

(III)

$R_1$ is a group (A), (B) or (III)

(A)

—$CR_6R_7R_8$ (B);

$R_2$ is hydrogen, $C_1$–$C_{12}$alkyl, halogen, the group (RG)—A— or, when $R_1$ is a group (A), two $R_2$ radicals in the ortho position relative to the carbonyl group together also are —S—

$R_3$ and $R_4$ are each independently of the other $C_1$–$C_6$alkyl, $C_1$–$C_6$alkanoyl, phenyl or benzoyl, wherein the radicals phenyl or benzoyl are each unsubstituted or substituted by halogen, $C_1$–$C_6$alkyl, $C_1$–$C_6$alkylthio or $C_1$–$C_6$alkoxy;

$R_5$ is hydrogen, halogen, $C_1$–$C_{12}$alkyl or $C_1$–$C_{12}$alkoxy or the group (RG)—A—;

$R_6$ is $OR_9$ or or $SO_2R_9$;

$R_7$ and $R_8$ are each independently of the other H, $C_1$–$C_{12}$alkyl, $C_2$–$C_{12}$alkenyl, $C_1$–$C_{12}$alkoxy, phenyl or benzyl or together are $C_2$–$C_6$alkylene;

$R_9$ is hydrogen, $C_1$–$C_6$alkyl or $C_1$–$C_6$alkanoyl;

$R_{10}$ is hydrogen, $C_1$–$C_{12}$alkyl or phenyl; and $X_1$ is oxygen or sulfur.

6. A process according to claim 4, wherein in the compounds of formula I or Ia (IN) is a group 7. A process according to claim 4, wherein in the compounds of formula I or Ia A is a spacer group —Z—[$(A_1)_a$—Y]$_c$—[$(A_2)_b$—X]$_d$;

X, Y and Z are each independently of any other(s) a single bond, —O—, —S—, —N($R_{10}$)—, —(CO)—, —(CO)O—, —(CO)N($R_{10}$)—, —O—(CO)—, —N($R_{10}$)—(CO)— or —N($R_{10}$)—(CO)O—;

$A_1$ and $A_2$ are each independently of any other(s) $C_1$–$C_4$alkylene, $C_3$–$C_{12}$cycloalkylene, phenylene, phenylene-$C_1$-$C_4$alkylene or $C_1$-$C_4$alkylenephenylene-$C_1$-$C_4$alkylene;

a, b, c and d are each independently of the others a number from 0 to 4; and $R_{10}$ is as defined hereinbefore.

8. A process according to claim 7, wherein in the compounds of formula I or Ia A is a spacer group —Z—[(CH$_2$)$_a$—Y]$_c$—[(CH$_2$)$_b$—X]$_d$— in which X, Y, Z, a, b, c and d are as defined hereinbefore.

9. A process according to claim 4, wherein in the compounds of formula I or Ia (RG) is $R_cR_bC=CR_a$—, (RG') is

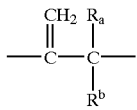

and $R_a$, $R_b$ and $R_c$ are each H or $C_1$-$C_6$alkyl, especially H or $CH_3$.

10. A process according to claim 1, wherein at least one of the ethylenically unsaturated monomers or oligomers of the composition is a mono-, di-, tri- or tetra-functional acrylate or methacrylate.

11. A process according to claim 1, wherein the composition comprising at least one ethylenically unsaturated monomer or oligomer comprises at least one further photoinitiator or coinitiator for the curing by UV/VIS radiation.

12. A process according to claim 1, wherein the process pressure is from $10^{-6}$ mbar up to atmospheric pressure.

13. A process according to claim 1, wherein there is used as plasma gas an inert gas or a mixture of an inert gas with a reactive gas.

14. A process according to claim 13, wherein $N_2$, He, Ar, Kr, Xe, $O_2$ and $H_2O$ are used on their own or in the form a mixture.

15. A process according to claim 1, wherein the photoinitiator is applied by vaporizarion at a temperature of 20° C. to 250° C.

16. A process according to claim 1, wherein the deposited photoinitiator layer or the metal layer has a thickness ranging from that of a monomolecular layer up to 100 nm.

17. A process according to claim 1, wherein the plasma treatment a) is carried out for from 1 second to 300 seconds.

18. A process according to claim 1, wherein the deposition of the photoinitiator b) is carried out for from 1 second to 10 minutes.

19. A process according to claim 1, wherein process step b) is carried out immediately after, or within 10 hours of, process step a).

20. An adherent coating obtained in accordance with a process according to claim 1.

* * * * *